(12) United States Patent
Guo

(10) Patent No.: US 10,863,010 B2
(45) Date of Patent: Dec. 8, 2020

(54) HOUSING COMPONENT OF TERMINAL DEVICE, AND TERMINAL

(71) Applicant: HUAWEI TECHNOLOGIES CO., LTD., Shenzhen (CN)

(72) Inventor: Renwei Guo, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/307,965

(22) PCT Filed: May 12, 2017

(86) PCT No.: PCT/CN2017/084086
§ 371 (c)(1),
(2) Date: Dec. 7, 2018

(87) PCT Pub. No.: WO2018/126576
PCT Pub. Date: Jul. 12, 2018

(65) Prior Publication Data
US 2020/0204663 A1    Jun. 25, 2020

(30) Foreign Application Priority Data

May 1, 2017    (CN) .......................... 2017 1 0007485

(51) Int. Cl.
*H04M 1/00* (2006.01)
*H04M 1/02* (2006.01)
(Continued)

(52) U.S. Cl.
CPC ......... *H04M 1/0266* (2013.01); *B05C 5/0212* (2013.01); *G06F 1/1626* (2013.01); *G06F 1/1656* (2013.01); *H05K 5/03* (2013.01)

(58) Field of Classification Search
CPC ... B05C 5/0212; G06F 1/1626; G06F 1/1637; G06F 1/1656; H04M 1/0266; H04M 1/18; H05K 5/03
See application file for complete search history.

(56) References Cited

U.S. PATENT DOCUMENTS 8,157,048 B2    4/2012    Banter et al.
2009/0066029 A1    3/2009    Mei et al.
(Continued)

FOREIGN PATENT DOCUMENTS

CN    103681049 A    3/2014
CN    103098314 B    9/2014
(Continued)

*Primary Examiner* — Nhan T Le
(74) *Attorney, Agent, or Firm* — Kilpatrick Townsend & Stockton LLP

(57) ABSTRACT

Embodiments of the present invention disclose a housing component of a terminal device, and a terminal. The housing component includes a front-housing component and a cover glass. The front-housing component includes a front housing and a plurality of supporting members disposed on a surface of the front housing. First glue guiding grooves are disposed on the surface of the front housing at intervals. Second glue guiding grooves are disposed on surfaces of the supporting members. Projections of the first glue guiding groove and the second glue guiding groove on the surface of the front housing are complete rings that do not overlap. Dispensing glue is disposed in the first glue guiding groove and the second glue guiding groove, so that the cover glass is in a sealed connection to the front-housing component.

7 Claims, 4 Drawing Sheets

(51) Int. Cl.
    *B05C 5/02*       (2006.01)
    *G06F 1/16*       (2006.01)
    *H05K 5/03*       (2006.01)

(56) References Cited

U.S. PATENT DOCUMENTS

| | | |
|---|---|---|
| 2012/0276768 A1 | 11/2012 | Schmidt et al. |
| 2013/0249390 A1* | 9/2013 | Nishikawa .......... H01L 51/5203 |
| | | 313/512 |
| 2014/0048351 A1 | 2/2014 | Banter |
| 2014/0055014 A1* | 2/2014 | Pan ........................ H05K 5/02 |
| | | 312/223.2 |
| 2014/0064542 A1 | 3/2014 | Bright et al. |
| 2014/0069786 A1 | 3/2014 | Werner et al. |
| 2014/0093095 A1 | 4/2014 | Slotte et al. |
| 2016/0156755 A1 | 6/2016 | Choi et al. |

FOREIGN PATENT DOCUMENTS

| | | |
|---|---|---|
| CN | 102568550 B | 3/2015 |
| CN | 105045347 A | 11/2015 |
| CN | 105120024 A | 12/2015 |
| CN | 105185260 A | 12/2015 |
| CN | 106210183 A | 12/2016 |
| EP | 3029915 A1 | 6/2016 |
| JP | 2013045830 A | 3/2013 |
| JP | 2014067916 A | 4/2014 |
| KR | 20160120897 A | 10/2016 |
| KR | 20170005755 A | 1/2017 |
| KR | 20190142118 A | 12/2019 |
| WO | 2007091600 A1 | 8/2007 |

* cited by examiner

HOUSING COMPONENT OF TERMINAL DEVICE, AND TERMINAL

CROSS-REFERENCE TO RELATED APPLICATIONS

This application is a national stage of International Application No. PCT/CN2017/084086, filed on May 12, 2017, which claims priority to Chinese Patent Application No. 201710007485.0, filed on Jan. 5, 2017. Both of the aforementioned applications are hereby incorporated by reference in their entireties.

TECHNICAL FIELD

The present invention relates to the field of terminal device technologies, and in particular, to a housing component of a terminal device, and a terminal.

BACKGROUND

Currently, various types of terminal devices such as smart phones, smartwatches, and tablet computers have been used in everyone's daily life. As use requirements of people are increasingly high, a requirement on waterproof performance of such a type of terminal devices is also increasingly high.

In the prior art, two common manners of connecting a cover glass of a screen of a terminal device to the terminal device are included. One manner is adhesion by using a double-sided adhesive tape, and the other manner is performing glue dispensing by using glue. Dispensing glue has a waterproof effect; however, as a waterproof standard is improved, a water leakage may occur at a joint between the cover glass and a supporting member.

SUMMARY

Embodiments of the present invention provide a housing component of a terminal device, and a terminal, to improve waterproof-sealing performance between a housing of a terminal device and a cover glass.

According to a first aspect, a specific embodiment of the present invention provides a housing component of a terminal device. The housing component includes a front-housing component and a cover glass. The front-housing component includes a front housing and a plurality of supporting members disposed on a surface of the front housing. First glue guiding grooves are disposed on the surface of the front housing at intervals. Second glue guiding grooves are disposed on surfaces of the supporting members. Projections of the first glue guiding groove and the second glue guiding groove on the surface of the front housing are complete rings that do not overlap. Dispensing glue is disposed in the first glue guiding groove and the second glue guiding groove, so that the cover glass is in a sealed connection to the front-housing component. The dispensing glue is disposed in the glue guiding groove on the front-housing component, to improve waterproof-sealing performance between the cover glass and the front-housing component.

In a possible design, the front housing includes a front-housing side wall and a front-housing bottom wall. The supporting member is a hexahedron including an upper surface and a lower surface that are parallel to each other and four facades between the upper and lower surfaces. The lower surface is attached to the front-housing bottom wall; one side of the supporting member away from the front-housing side wall is perpendicular to the front-housing bottom wall; and at least one of other three surfaces of the supporting member is a slope. A plurality of facades of the supporting member are set as slopes, so that the dispensing glue between the front-housing component and the cover glass is squeezed more tightly.

In a possible design, there are a plurality of first glue guiding grooves and there are a plurality of second glue guiding grooves. The projections of the first glue guiding grooves and the second glue guiding grooves on the surface of the front housing are a plurality of complete rings that do not overlap. At least one ring partially overlaps with a projection of the supporting member on a surface of the housing.

In a possible design, the glue guiding groove is formed through laser engraving.

According to a second aspect, a specific embodiment of the present invention provides a terminal, including any one of the housing components according to the first aspect.

According to a third aspect, the terminal according to the second aspect is a mobile phone.

According to a fourth aspect, the terminal according to the second aspect is a tablet computer.

According to a fifth aspect, a specific embodiment of the present invention provides a method for connecting the housing component of a terminal device. First dispensing glue is disposed in the first glue guiding groove on the surface of the front housing. Second dispensing glue is disposed in the second glue guiding groove on the supporting member. The second dispensing glue covers the supporting member. The first dispensing glue and the second dispensing glue have a same height in a direction of the front-housing side wall. The front-housing component is connected to the cover glass by using the first dispensing glue and the second dispensing glue.

The embodiments of the present invention provide the housing component of a terminal device, and the terminal. The surface of the front-housing component further includes a glue guiding groove whose projection is a ring. Dispensing glue is disposed in the glue guiding groove on the front-housing component, to connect the front-housing component to the cover glass. Therefore, waterproof-sealing performance of the connection between the cover glass and the front-housing component is improved.

DESCRIPTION OF EMBODIMENTS

The technical solutions in the embodiments of the present invention are further described in detail below with reference to accompanying drawings and embodiments.

Figure 1A:
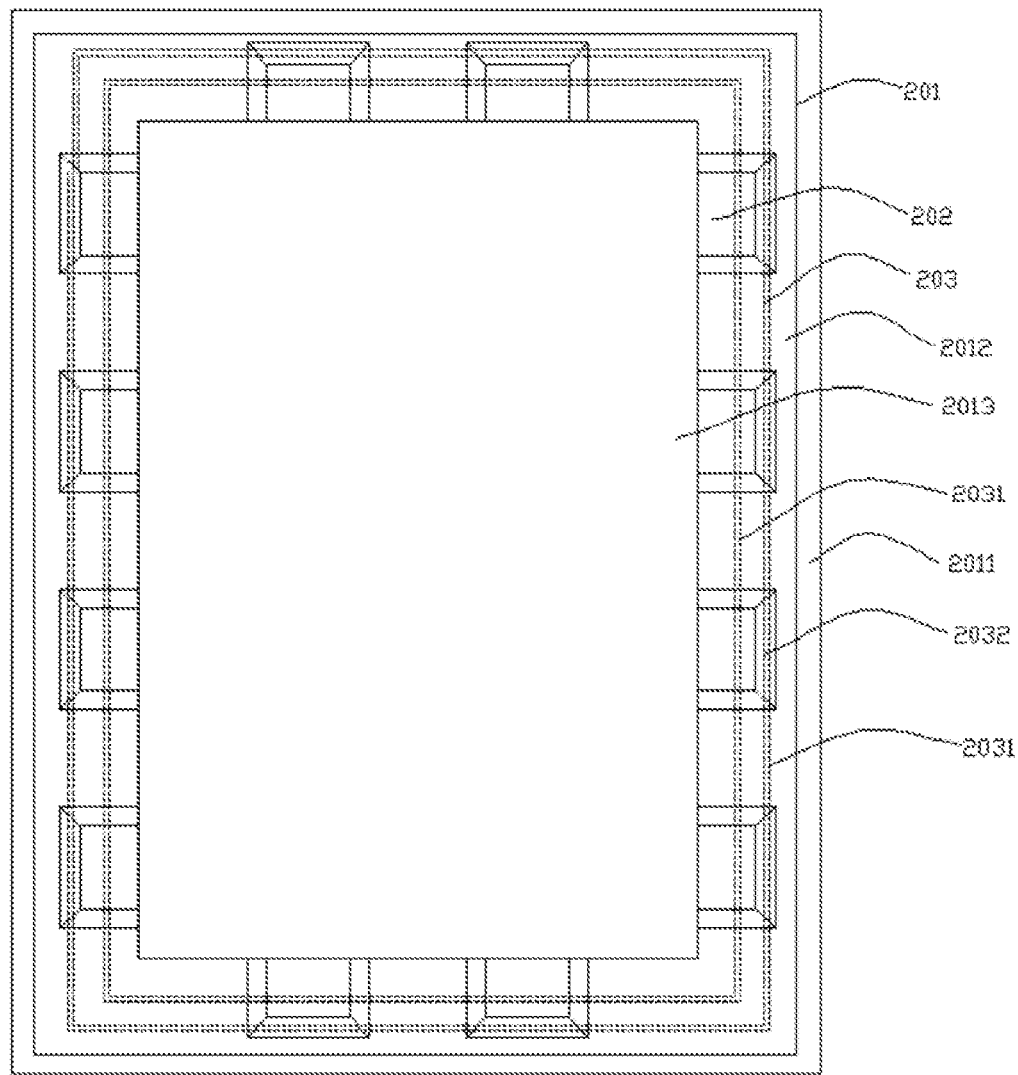
FIG. 1a is a top view of a housing component according to a specific embodiment of the present invention.
Figure 1B:
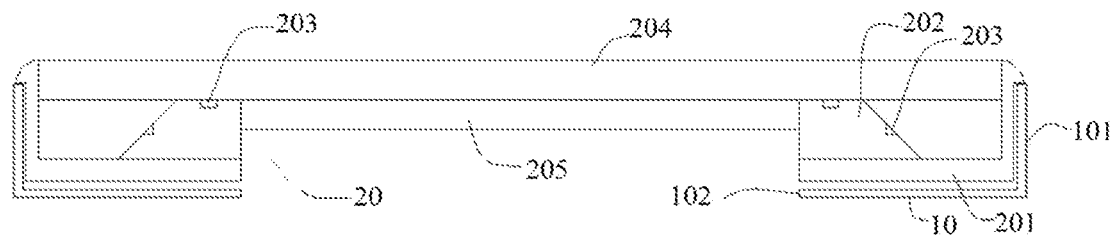
FIG. 1b is a sectional view of a housing component according to a specific embodiment of the present invention.

FIG. 1a is a top view of a housing component according to a specific embodiment of the present invention. FIG. 1b is a sectional view of a housing component according to a specific embodiment of the present invention. As shown in FIG. 1a and FIG. 1b, a housing component 20 includes a back housing 10 and a front-housing component 20. The back housing 10 further includes a back-housing side wall 101 and a back-housing bottom wall 102. The front-housing component 20 is disposed in the back housing 10. The front-housing component 20 includes a front housing 201 and supporting members 202. The supporting member 202 is fixedly disposed on the front housing 201.

The front housing 201 has a frame structure, and includes a front-housing side wall 2011 and a front-housing bottom wall 2012. The front-housing side wall 2011 is configured to connect to the back housing 10. The supporting member 202 and another corresponding component are disposed on the front-housing bottom wall 2012. A rectangular opening 2013 is included in the middle of the front-housing bottom wall 2012, and a display screen 206 is disposed in the rectangular opening 2013. In a specific embodiment of the present invention, a plurality of supporting members 202 are disposed on the front-housing bottom wall 2012. The supporting members 202 are disposed around the bottom wall 2012 along the rectangular opening. A cover glass (Cover Glass, CG) 205 is disposed on the supporting member 202. Dispensing glue is disposed between the front-housing component 20 and the cover glass 205. The front-housing component 20 is fixed with the cover glass 205 by using the dispensing glue.

In a specific embodiment of the present invention, a surface of the front-housing component 20 further includes glue guiding grooves 203. The glue guiding grooves include first glue guiding grooves 2031 and second glue guiding grooves 2032. The first glue guiding grooves 2031 are disposed on a surface of the front-housing bottom wall 2012 at intervals, and the second glue guiding grooves 2032 are disposed on surfaces of the supporting members 202. Projections of the first glue guiding grooves 2031 and the second glue guiding grooves 2032 on a surface of the front housing 201 are complete rings that do not overlap, and the ring is a closed ring encircled by a frame of the front housing 201. To be specific, no second glue guiding groove 2032 is disposed at a position at which a supporting member 202 is disposed on the front-housing bottom wall 2012; and a first glue guiding groove 2031 is disposed at a position at which no supporting member 202 is disposed on the front-housing bottom wall 2012.

In an example, the front-housing component 20 is processed through laser engraving, to form the glue guiding groove 203 on the surface of the front-housing component 20. Dispensing glue is disposed in the glue guiding groove 203 on the front-housing component 20, so that the cover glass 205 is in a sealed connection to the front-housing component 20.

The glue guiding groove 203 is disposed on the supporting member 202, thereby preventing deterioration in waterproof performance because the supporting member 202 and the cover glass 205 cannot be sealed when the cover glass 205 is directly connected to front-housing component 20 on the front-housing component 20 by using the dispensing glue.

Optionally, the front-housing component 20 may include a plurality of first glue guiding grooves 2031 and a plurality of second glue guiding grooves 2032. Projections of the plurality of first glue guiding grooves 2031 and the plurality of second glue guiding grooves 2032 on the surface of the front-housing bottom wall 2012 are a plurality of complete rings that do not overlap. Therefore, when the front-housing component 20 is connected to the cover glass 205 by using the dispensing glue, a plurality of sealing surfaces are formed, thereby improving waterproof performance between the front-housing component 20 and the cover glass 205.

Figure 2:
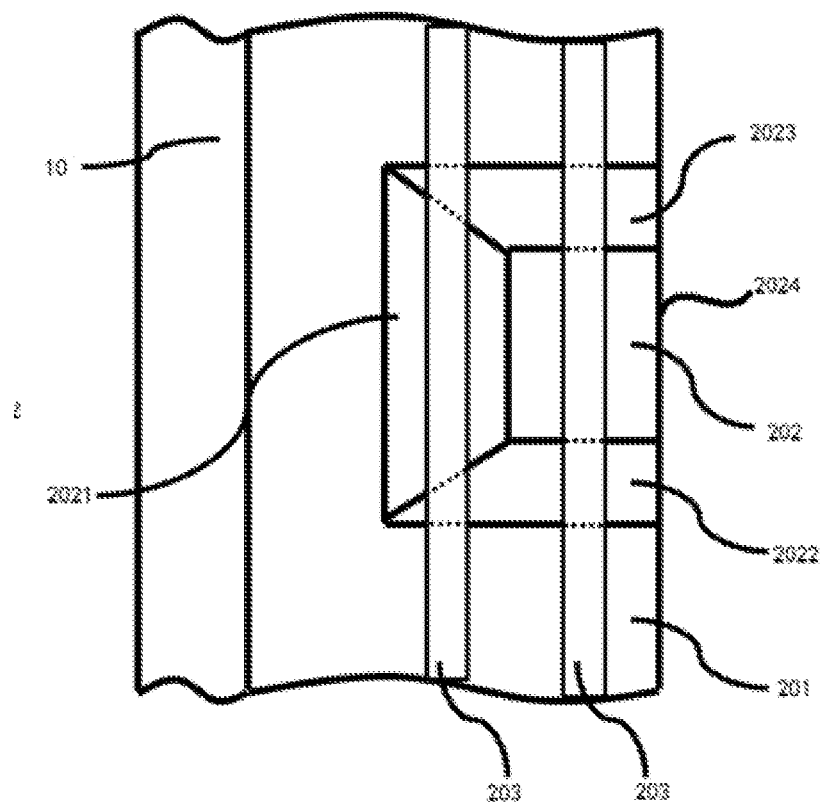
FIG. 2 is a local top view of a front-housing component according to a specific embodiment of the present invention.

FIG. 2 is a local top view of a front-housing component according to a specific embodiment of the present invention. As shown in FIG. 2, in a specific embodiment of the present invention, the supporting member 202 is a hexahedron. The hexahedron includes an upper surface and a lower surface that are parallel to each other, and four facades between the upper and lower surfaces. The lower surface is attached to the front-housing bottom wall 2012. In the four facades, one facade is a vertical plane 2024, and the vertical plane 2024 is away from the front-housing side wall 2011, and is perpendicular to the front-housing bottom wall 2012. In the four facades, at least one of other three facades than the vertical plane 2024 may be a slope. In this embodiment of the present invention, an example in which the three facades are all slopes, for example, a first slope 2021, a second slope 2022, and a third slope 2023, is used. The second slope 2022 and the third slope 2023 are separately adjacent to the first slope 2021.

In the foregoing example, when the front-housing component 20 includes two glue guiding grooves 203 whose projections are complete rings that do not overlap, the second glue guiding groove 2032 penetrates through a top surface, the second slope 2022, and the third slope 2023 of the supporting member 202, and the second glue guiding groove 2032 penetrates through the first slope 2021.

Based on a hexahedron structure in which there are a plurality of facades that are slopes between the upper surface and the lower surface of the supporting member 202, when the cover glass 205 is connected to the front-housing component 20 by using the dispensing glue, sealing performance between the cover glass 205 and the front-housing component 20 is improved.

Figure 3:
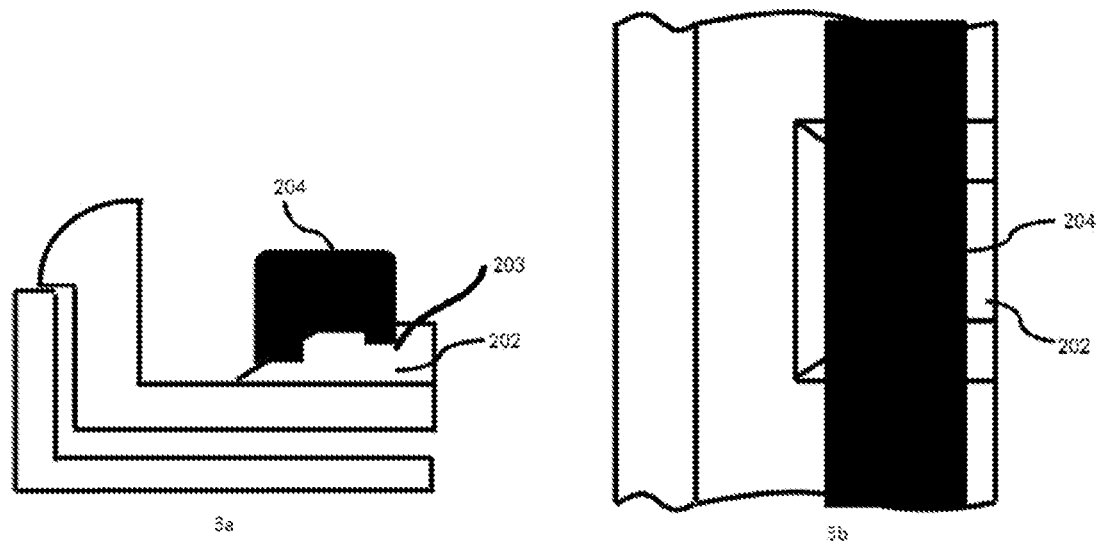
FIG. 3 is a schematic structural diagram after glue dispensing is performed at a position of a supporting member of a housing component according to a specific embodiment of the present invention.
Figure 4:
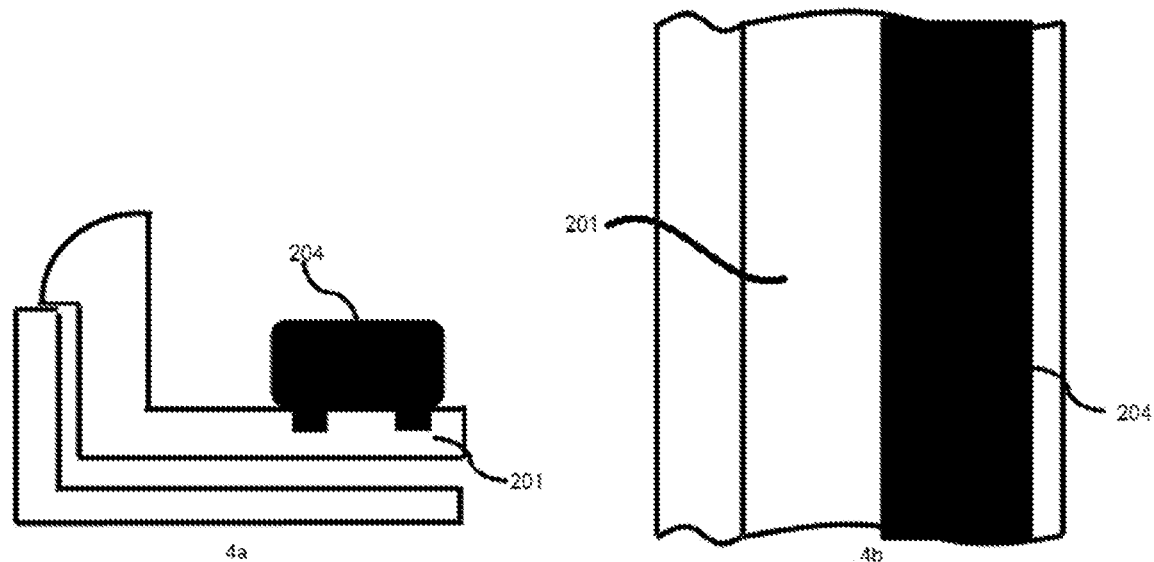
FIG. 4 is a schematic structural diagram after glue dispensing is performed at a position of a front housing of a housing component according to a specific embodiment of the present invention.

FIG. 3 is a schematic structural diagram after glue dispensing is performed at a position of a supporting member of a housing component according to a specific embodiment of the present invention. FIG. 3a is a schematic sectional view, and FIG. 3b is a top view. FIG. 4 is a schematic structural diagram after glue dispensing is performed at a position of a front housing of a housing component according to a specific embodiment of the present invention. FIG. 4a is a schematic sectional view, and FIG. 4b is a top view. As shown in FIG. 3 and FIG. 4, dispensing glue 204 is disposed in the glue guiding groove 203, to connect the cover glass 205 to the front-housing component 20.

Figure 5:
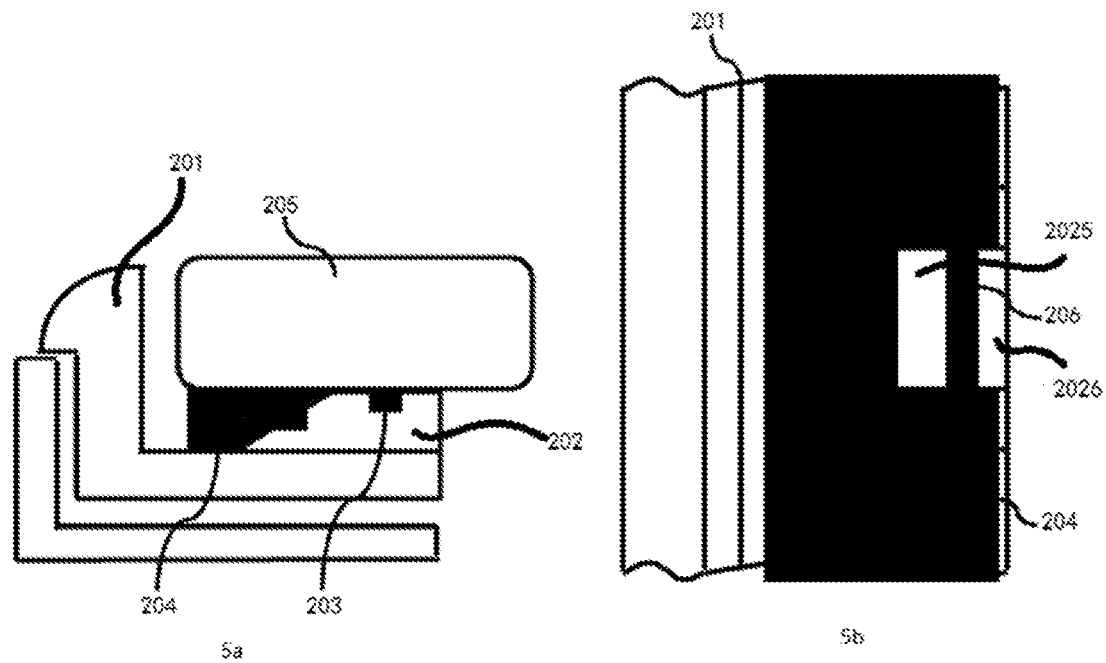
FIG. 5 is a local sectional view at a position of a supporting member after a housing component is connected to a cover glass according to a specific embodiment of the present invention.
Figure 6:
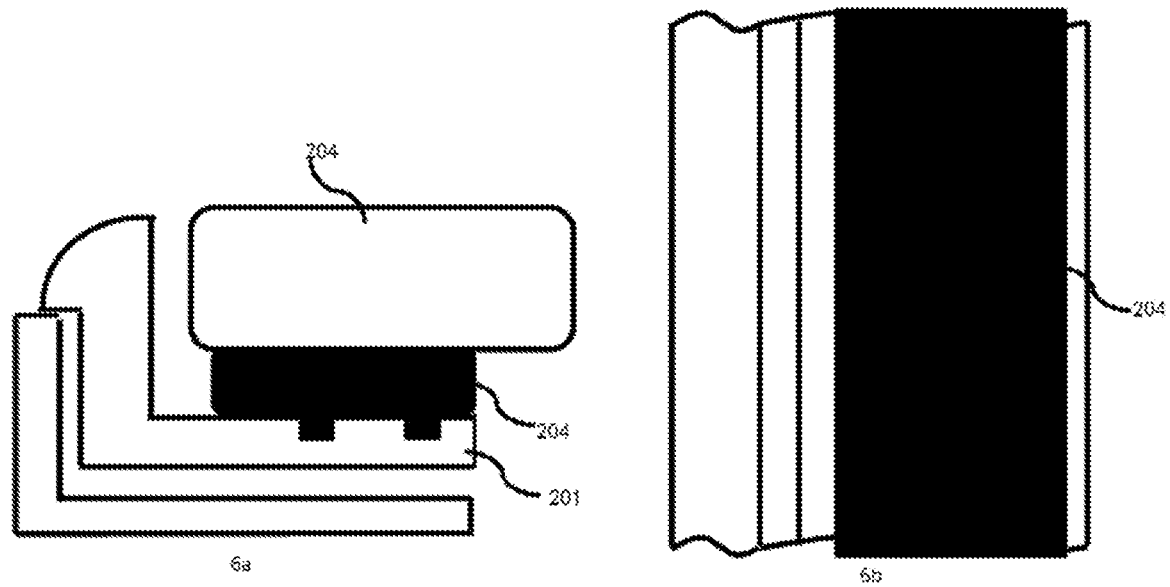
FIG. 6 is a local sectional view at a position of a front housing after a housing component is connected to a cover glass according to a specific embodiment of the present invention.

FIG. 5 is a local sectional view at a position of a supporting member after a housing component is connected to a cover glass according to a specific embodiment of the present invention. FIG. 5a is a schematic sectional view, and FIG. 5b is a top view. FIG. 6 is a local sectional view at a position of a front housing after a housing component is connected to a cover glass according to a specific embodiment of the present invention. As shown in FIG. 6, FIG. 6a is a schematic sectional view, and FIG. 6b is a top view. As shown in FIG. 5 and FIG. 6, when the front-housing component 20 is connected to the cover glass 205, the dispensing glue 204 is squeezed. Because the supporting member 202 includes the glue guiding groove 203, the dispensing glue 204 disperses along the supporting member 202, and the connection between the front-housing component 20 and a cover glass 205 is tighter. Because the supporting member 202 also includes the glue guiding groove 203, the glue guiding grooves 203 is divided into a first supporting surface 2025 and a second supporting surface 2026 by using the dispensing glue 204. The first supporting surface 2025 and the second supporting surface 2026 are sealed by using a sealing surface 206 that is formed by using the dispensing glue 204. Because a connection surface between the supporting member 202 and the cover glass 205 may easily have a gap, the sealing surface 206 is formed between the supporting member 202 and the front-housing component 20 by using the glue guiding groove 203 that penetrates through the supporting member 202.

Figure 7:
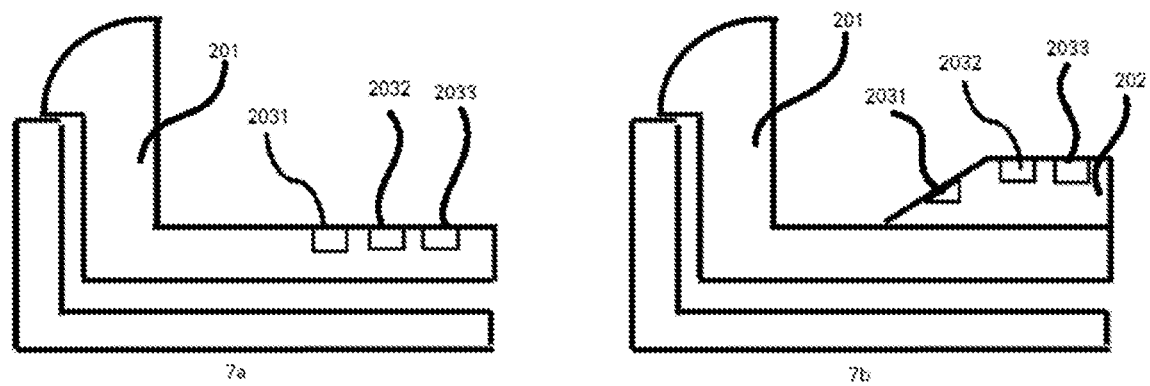
FIG. 7 shows a housing component according to a specific embodiment of the present invention.

In a specific embodiment of the present invention, there may be a plurality of forms of glue guiding grooves disposed on the front-housing component. FIG. 7 shows a housing component according to a specific embodiment of the present invention. FIG. 7a is a local sectional view at a position of a front housing, and FIG. 7b is a local sectional view at a position of a supporting member. As shown in FIG. 7, a glue guiding groove 2031 having a first ring projection, a glue guiding groove 2032 having a second ring projection, and a glue guiding groove 2033 having a third ring projection are included. Therefore, after the front-housing component 20 is connected to the cover glass 205, more sealing surfaces 206 are formed, thereby improving sealing performance between the front-housing component 20 and the cover glass 205.

In a specific embodiment of the present invention, a method for connecting to a housing component of a terminal device is further provided. First dispensing glue is disposed in the first glue guiding groove on the surface of the front housing. Second dispensing glue is disposed in the second glue guiding groove on the supporting member. The second dispensing glue covers the supporting member. The first dispensing glue and the second dispensing glue have a same height in a direction of the front-housing side wall. The front-housing component is connected to the cover glass by using the first dispensing glue and the second dispensing glue.

In a specific embodiment of the present invention, the terminal device is any device such as a mobile phone or a tablet computer.

In the foregoing specific implementations, the objective, technical solutions, and beneficial effects of the present invention are further described in detail. It should be understood that the foregoing descriptions are merely specific implementations of the present invention, but are not intended to limit the protection scope of the present invention. Any modification, equivalent replacement, or improvement made without departing from the spirit and principle of the present invention should fall within the protection scope of the present invention.

What is claimed is:

1. A housing component of a terminal device, comprising a front-housing component and a cover glass, wherein the front-housing component comprises a front housing and a plurality of supporting members disposed on a surface of the front housing; and, wherein
   on a surface of the front housing, first glue guiding grooves are disposed at intervals;
   on surfaces of the supporting members, second glue guiding grooves are disposed, wherein
      projections of the first glue guiding groove and the second glue guiding groove on the surface of the front housing form complete rings that do not overlap, and
      dispensing glue is disposed in the first glue guiding groove and the second glue guiding groove for forming a sealed connection to the front-housing component for the cover glass;
   the front housing component comprises a front-housing side wall and a front-housing bottom wall; and
   the supporting member is a hexahedron comprising an upper surface and a lower surface that are parallel to each other, and four facades between the upper and lower surfaces, the lower surface being attached to the front-housing bottom wall, one side of the supporting member away from the front-housing side wall being perpendicular to the front-housing bottom wall, and at least one of other three surfaces of the supporting member being a slope.

2. The housing component according to claim 1, wherein at least one ring partially overlaps with a projection of the supporting member on the surface of the front housing.

3. The housing component according to claim 1, wherein the glue guiding groove is formed through laser engraving.

4. A terminal device, comprising the housing component of claim 1.

5. The terminal device according to claim 4, wherein the terminal device is a mobile phone.

6. The terminal device according to claim 4, wherein the terminal is a tablet computer.

7. A method for connecting the housing component of a terminal device, wherein the housing component comprises a front-housing component and a cover glass, wherein the front-housing component comprises a front housing and a plurality of supporting members disposed on a surface of the front housing; and, wherein
   on a surface of the front housing, first glue guiding grooves are disposed at intervals; and
   on surfaces of the supporting members, second glue guiding grooves are disposed, wherein
      projections of the first glue guiding groove and the second glue guiding groove on the surface of the front housing form complete rings that do not overlap; and, wherein the method comprises:
   dispensing glue is disposed in the first glue guiding groove and the second glue guiding groove for forming a sealed connection to the front-housing component for the cover glass
   disposing first dispensing glue in the first glue guiding groove on the surface of the front housing;
   disposing second dispensing glue in the second glue guiding groove on the supporting member, wherein the second dispensing glue covers the supporting member, wherein the first dispensing glue and the second dispensing glue have a same height in a direction of the front-housing side wall; and
   using the first dispensing glue and the second dispensing glue to connect the front-housing component to the cover glass.

* * * * *